(12) United States Patent
Smith et al.

(10) Patent No.: US 8,488,230 B2
(45) Date of Patent: Jul. 16, 2013

(54) FABRICATION OF A FLOATING ROCKER MEMS DEVICE FOR LIGHT MODULATION

(75) Inventors: Charles Gordon Smith, Cambridge (GB); Richard L. Knipe, McKinney, TX (US)

(73) Assignee: CAVENDISH KINETICS, Inc., San Jose, CA (US)

( * ) Notice: Subject to any disclaimer, the term of this patent is extended or adjusted under 35 U.S.C. 154(b) by 186 days.

(21) Appl. No.: 12/862,036

(22) Filed: Aug. 24, 2010

(65) Prior Publication Data

US 2011/0043892 A1    Feb. 24, 2011

Related U.S. Application Data

(60) Provisional application No. 61/236,373, filed on Aug. 24, 2009.

(51) Int. Cl.
G02B 26/00    (2006.01)
(52) U.S. Cl.
USPC .......................... 359/290; 359/291
(58) Field of Classification Search
USPC .................................. 359/290–292
See application file for complete search history.

(56) References Cited

U.S. PATENT DOCUMENTS

| 6,441,405 | B1 | 8/2002 | Smith |
| 2002/0175284 | A1* | 11/2002 | Vilain ........................ 250/338.1 |
| 2007/0018761 | A1* | 1/2007 | Yamanaka et al. .............. 335/78 |
| 2008/0068697 | A1* | 3/2008 | Haluzak et al. ............... 359/224 |
| 2008/0094680 | A1* | 4/2008 | Nanjyo et al. ................ 359/214 |
| 2010/0067096 | A1* | 3/2010 | Ichikawa et al. .............. 359/295 |

FOREIGN PATENT DOCUMENTS

WO    WO-02/073691 A1    9/2002

OTHER PUBLICATIONS

International Search Report and Written Opinion for PCT/US2010/046425 dated Jun. 1, 2011.

* cited by examiner

*Primary Examiner* — James Jones
(74) *Attorney, Agent, or Firm* — Patterson & Sheridan, LLP

(57) ABSTRACT

The current disclosure shows how to make a fast switching array of mirrors for projection displays. Because the mirror does not have a via in the middle connecting to the underlying spring support, there is an improved contrast ratio that results from not having light scatter off the legs or vias like existing technologies. Because there are no supporting contacts, the mirror can be made smaller making smaller pixels that can be used to make higher density displays. In addition, because there is not restoring force from any supporting spring support, the mirror stays in place facing one or other direction due to adhesion. This means there is no need to use a voltage to hold the mirror in position. This means that less power is required to run the display.

7 Claims, 9 Drawing Sheets

FABRICATION OF A FLOATING ROCKER MEMS DEVICE FOR LIGHT MODULATION

CROSS-REFERENCE TO RELATED APPLICATIONS

This application claims benefit of U.S. Provisional Patent Application Ser. No. 61/236,373 (CK063L), filed Aug. 24, 2009, which is herein incorporated by reference.

BACKGROUND OF THE INVENTION

1. Field of the Invention

The embodiments discussed herein cover the fabrication and use of a free floating element in a micro electro mechanical system (MEMS) that is un-tethered during the release process. The embodiments can be used in a rocker design where the free floating element lands on a rocking post and has two stable positions, either leaning to the left or leaning to the right. Such a structure can be used as a bi-stable switch for optical applications. An array of these floating rockers can be used for video projectors. These projectors can be used in conjunction with a computer for presentations or for video entertainment or in high definition applications as a cinema projector. The same technology can also be used for back projection TV. Because it is not mechanically tethered like a cantilever or tethered rocker, the floating rocker is only held in any stable position by adhesion forces. The floating rocker can be switched using any force, from inertial, magnetic and electrostatic. The advantage of not having a spring like cantilever attachment means that the floating rocker can move between one stable state and the next very quickly as there is no spring like restoring force from the cantilever to overcome. This allows for faster dithering and giving a better image with less perceptible flicker and better control of color and grey scale. It is also better for games applications or sports programs. Not having the restoring spring reduces the cost of manufacture as fewer processing steps are utilized to fabricate the device and variation in the production of the spring arms is removed. Also, not having a restoring spring like arm, variations in temperature do not alter the switching properties, making the switching properties less susceptible to temperature variations. Because the mirror is now not attached, more of the area can be used for reflection as there is no need to connect the mirror to the substrate with a via as is required if it is tethered.

2. Description of the Related Art

One problem that is often encountered with the fabrication of MEMS devices is that when they are designed as cantilevers, there is a variation in the restoring force of the cantilever due to variations in the width, thickness and length as well as adhesion forces at the cantilever. The spring like arm which is normally used to hold a spring like rocker in position is removed in the case of the floating rocker. This spring like arm sets the voltage required for switching and is sensitive to variations in the processing parameters such as the lithographic width and length.

When the rocker touches down, variations in adhesion also come into play. In making a display, it is important that each pixel is closely spaced giving a high packing density. This means that there is not room to fit the restoring arm in the same metallization layer as the reflective pixel material. Also, the reflective pixel material has to be optimized for high reflectivity and so can not be made at the same time as the spring arm which needs to be thin to make it compliant.

The use of a free floating element has been discussed before in U.S. Pat. No. 6,441,405 (B1). That patent discussed the use of a free floating element and how it has advantages over a cantilever, but does not fully disclose how this can be used to make a bi-stable rocker display which will not switch due to variations in temperature.

SUMMARY OF THE INVENTION

Using a floating rocker, the variations in the spring like restoring arm are removed and the adhesion is used to hold the rocker either rocked one way or the other. In normal operation as a switch, the floating rocker would be operated by applying voltages to an electrode under one side or other of the rocker. With a transparent package above the floating rocker, this device could be used as a pixel in a projection display chip. By measuring the electrical resistance through the rocker pivot to one end or the other, the position of the rocker can be continually monitored.

The current disclosure shows how to make a fast switching array of mirrors for projection displays. Because the mirror does not have a via in the middle connecting to the underlying spring support, there is an improved contrast ratio that results from not having light scatter off the legs or vias like existing technologies. Because there are no supporting contacts, the mirror can be made smaller making smaller pixels that can be used to make higher density displays. In addition, because there is not restoring force from any supporting spring support, the mirror stays in place facing one or other direction due to adhesion. This means there is no need to use a voltage to hold the mirror in position. This means that less power is required to run the display.

To operate the display each pixel can be twinned with an SRAM memory cell so the information required for the pixels next action is stored into the SRAM. The fact there is no restoring force also means full mechanical latching based on stiction. This allows for the data under the pixel to be written prior to reset for better memory efficiency and better overall optical efficiency. When the memory state of the SRAM is changed, the pixel won't follow because the adhesion keeps it in place until the reset pulse is applied. This reset pulse is large enough to overcome the adhesion force.

In one embodiment, a floating rocker MEMS device fabrication method is disclosed. The method includes depositing a first titanium nitride layer over a substrate, patterning the first titanium nitride layer and etching the first titanium nitride layer. The method also includes depositing a second titanium nitride layer over the etched, first titanium nitride layer, patterning the second titanium nitride layer and etching the second titanium nitride layer. The method also includes depositing a first sacrificial layer over the etched, second titanium nitride layer, patterning the first sacrificial layer and etching the first sacrificial layer. The method also includes depositing a mirror layer over the etched, first sacrificial layer, depositing a second sacrificial layer over the mirror layer and depositing a transparent layer over the second sacrificial layer to encapsulate the second sacrificial layer, the mirror layer, the etched, first sacrificial layer, the etched, second titanium nitride layer and the etched, first titanium nitride layer. The method also includes etching a hole through the transparent layer, plasma etching the second sacrificial layer and the etched, first sacrificial layer to form a discrete, floating rocker and filling the hole with a material selected from the group consisting of metal and dielectric material.

In another embodiment, a floating rocker MEMS device fabrication method is disclosed. The method includes depositing a first titanium nitride layer over a substrate, patterning the first titanium nitride layer and etching the first titanium nitride layer. The method also includes depositing a second titanium nitride layer over the etched, first titanium nitride layer, patterning the second titanium nitride layer and etching the second titanium nitride layer. The method also includes depositing a first sacrificial layer over the etched, second titanium nitride layer, patterning the first sacrificial layer and etching the first sacrificial layer. The method also includes depositing a mirror layer over the etched, first sacrificial layer, depositing a second sacrificial layer over the mirror layer and depositing a transparent layer over the second sacrificial layer to encapsulate the second sacrificial layer, the mirror layer, the etched, first sacrificial layer, the etched, second titanium nitride layer and the etched, first titanium nitride layer. The method also includes patterning the transparent layer, plasma etching the second sacrificial layer and the etched, first sacrificial layer to form a discrete, floating rocker and packaging the discrete, floating rocker.

In another embodiment, a floating rocker MEMS device fabrication method is disclosed. The method includes depositing a conductive layer over a first sacrificial layer and one or more conductive electrodes and depositing a second sacrificial layer over the conductive layer. The method also includes enclosing the first sacrificial layer, conductive layer and second sacrificial layer within a cavity. The method additionally includes removing the second sacrificial layer and the first sacrificial layer to release the conductive layer within the cavity such that the conductive layer forms a discrete, floating rocker that rests on a fulcrum and pivots into and out of contact with the one or more conductive electrodes. The cavity is then sealed.

In another embodiment, a floating MEMS device fabrication method is disclosed. The method includes depositing a conductive layer over a first sacrificial layer and a plurality of conductive electrodes, patterning the conductive layer to form a first mirror element and a second mirror element, and depositing a second sacrificial layer over the first mirror element and the second mirror element. The method also includes enclosing the first sacrificial layer, first mirror element, the second mirror element and second sacrificial layer within a cavity and removing the second sacrificial layer and the first sacrificial layer to release the first mirror element and the second mirror element within the cavity such that the first mirror element is a discrete, floating first rocker that rests on a first fulcrum and pivots into and out of contact with a first conductive electrode of the plurality of conductive electrodes and the second mirror element is a discrete, floating second rocker that rests on a second fulcrum and pivots into and out of contact with a second conductive electrode of the plurality of conductive electrodes. The cavity is then sealed.

In another embodiment, a method includes applying a first electrical current to one or more electrodes to pivot one or more discrete mirror elements on a fulcrum, shining light through a first lens onto the one or more discrete mirror elements, and shining the reflected light through a second lens onto a screen.

It is to be understood that the first sacrificial layer, the reflective metal layer (or mirror layer) and the second or top sacrificial layer may be etched together in the same step and same process using the same etchant.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
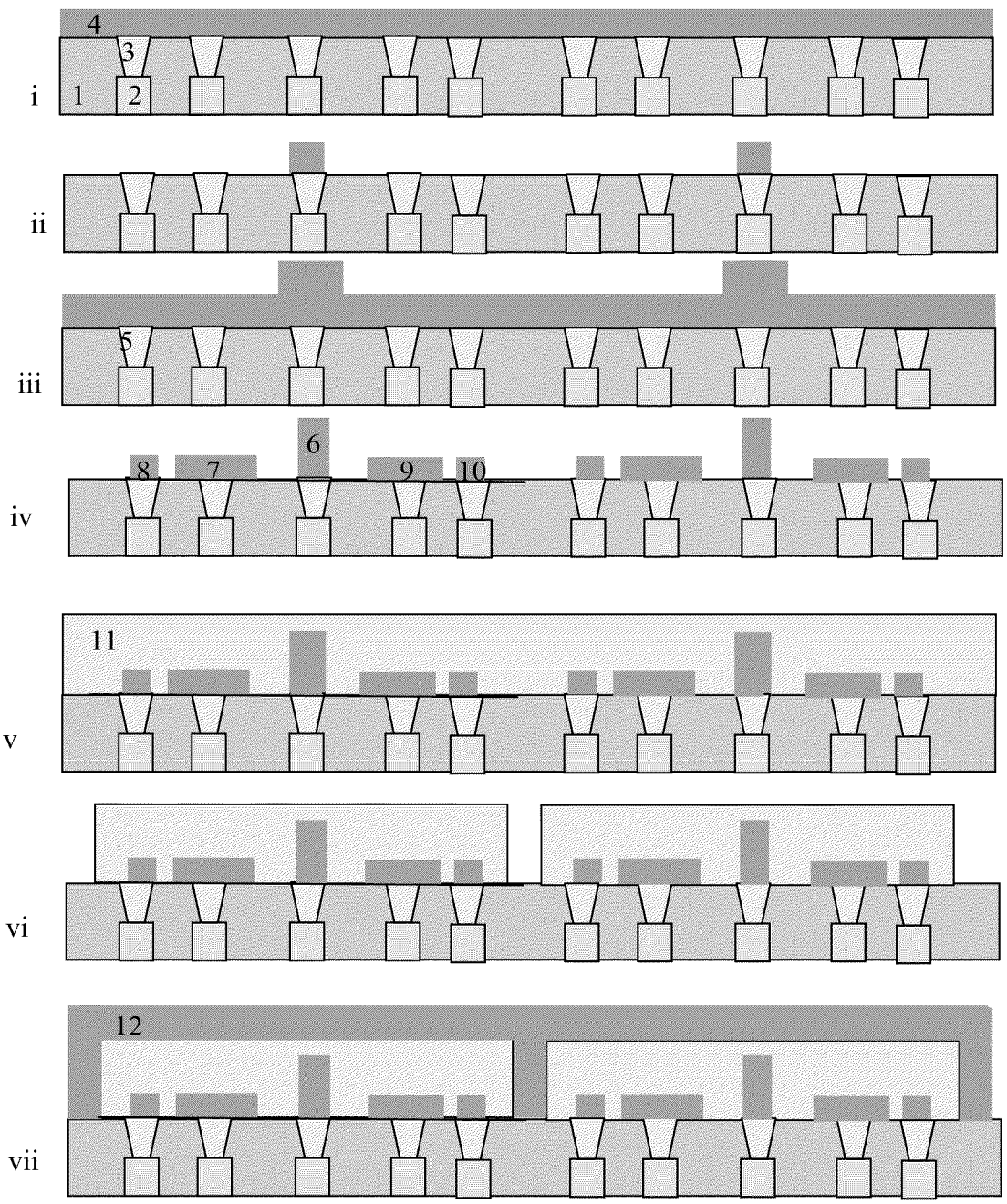
FIG. 1A i-vii shows part of the fabrication process.

FIG. 1A shows how the floating rocker device could be manufactured. Initially the substrate material is prepared with vias 3 from metal tracks 2 leading up through an insulating layer that could be silicon dioxide or silicon nitride or some other insulating or semi-insulating layer. This could be the interlayer dielectric of a CMOS device with active CMOS addressing for the mirror array defined underneath. The first MEMS layer to be deposited could be a TiN layer which will be used for part of the base for the post 6 which the rocker will land on when released. The first MEMS layer is patterned using optical lithography processes usually found in semiconductor processing plant. The optical lithography processes could include wet etching of the metal layer under a patterned resist layer or dry etching of the layer using a plasma etch process.

After the first MEMS layer is etched to leave the base of the post 6, a second layer which may also be TiN, will be deposited. The second layer is then patterned and etched to form the landing electrodes 8 and 10 as well as the switching electrodes 7 and 9 and the top part of post 6. Next a sacrificial layer 11 is put down. The sacrificial layer 11 could be a SiN layer or a spin on glass or any other sacrificial layer that can be removed using reactive ion etching. The sacrificial layer 11 is then patterned into a shape that could also have lateral protrusions (see later figure) which could provide lateral release channels to allow the sacrificial layer 11 to be etched out through a hole in a side wall surrounding the mirror.

The mirror layer 12 is then deposited onto the sacrificial layer 11. The mirror layer 12 could consist of a thin TiN base to provide good electrical contact to the central pillar capped with a thick Al layer which is thermally heat treated to ensure a very smooth reflective surface.

A second sacrificial layer 13 is then deposited onto the wafer and then patterned into an appropriate shape. The second sacrificial layer 13 could be the same sacrificial material as sacrificial layer 11 or could be a different material. For designs which are micro encapsulated, a transparent layer 14 is not deposited over the second sacrificial layer 13. The second sacrificial layer 13 could be silicon dioxide or silicon nitride with a thickness that provides mechanical strength but does not lead to any significant optical absorption. The two sacrificial layer thicknesses and pillar height are chosen so that the rocker can pivot without touching the top window. The top sacrificial layer and top window also has to be chosen so that when the rocker pivots it does not cause Fabry-Perot resonances between light reflected off the rocker interfering with light reflected off the inside of the window.

A hole is then etched through the material coating the top sacrificial layer, either from the top as shown or from the side. The sacrificial layer is then etched away using a plasma etch process. The etch holes are positioned to etch out the sacrificial material first around the post and landing electrodes. This ensures that they are clean before the rest of the sacrificial layer is removed and the rocker is pulled down to the substrate by van der Waals forces. The ratio of the top sacrificial layer to the bottom sacrificial layer is chosen so that the adhesion forces are larger underneath the rocker than those above. This ensures the rocker is always pulled down on release.

In some embodiments it may be useful to use an indium tin oxide or other conducting transparent electrode for the top window. This ensures the rockers are not disturbed by external electric fields. Finally a metal layer (or dielectric layer) 16 is deposited to fill the hole through which the sacrificial material has been removed. The metal or dielectric layer 16 is then removed from over the top of the window where the rocker mirror is. The metal or dielectric layer 16 should be deposited in the same chamber of a cluster tool that the sacrificial material was removed in. This ensures that the devices are never exposed to air during the release and seal process creating a cavity for each mirror which has a low pressure controlled atmosphere.

Figure 1B:
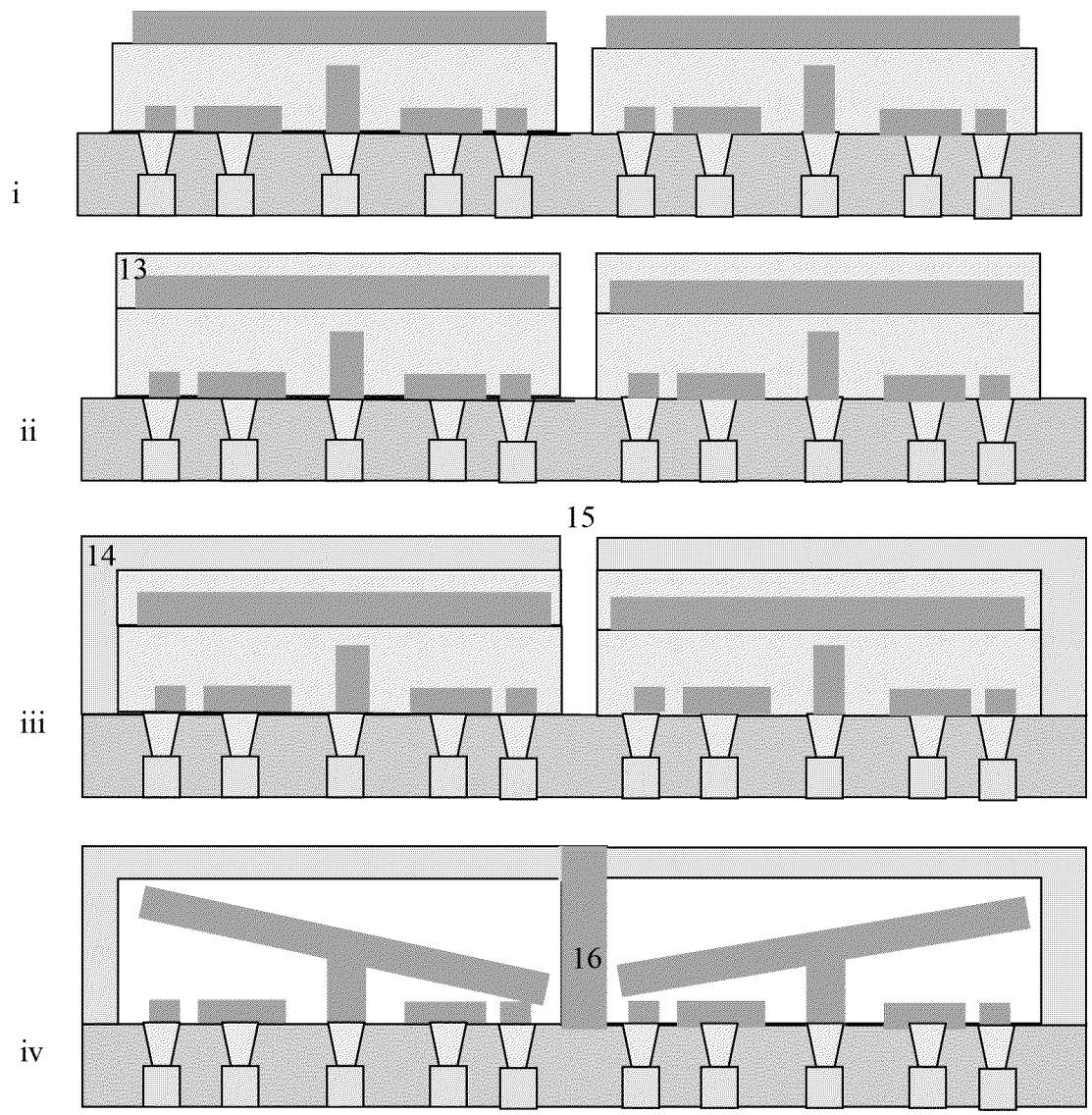
FIG. 1B i-iv shows the second half of the fabrication process.
Figure 1C:
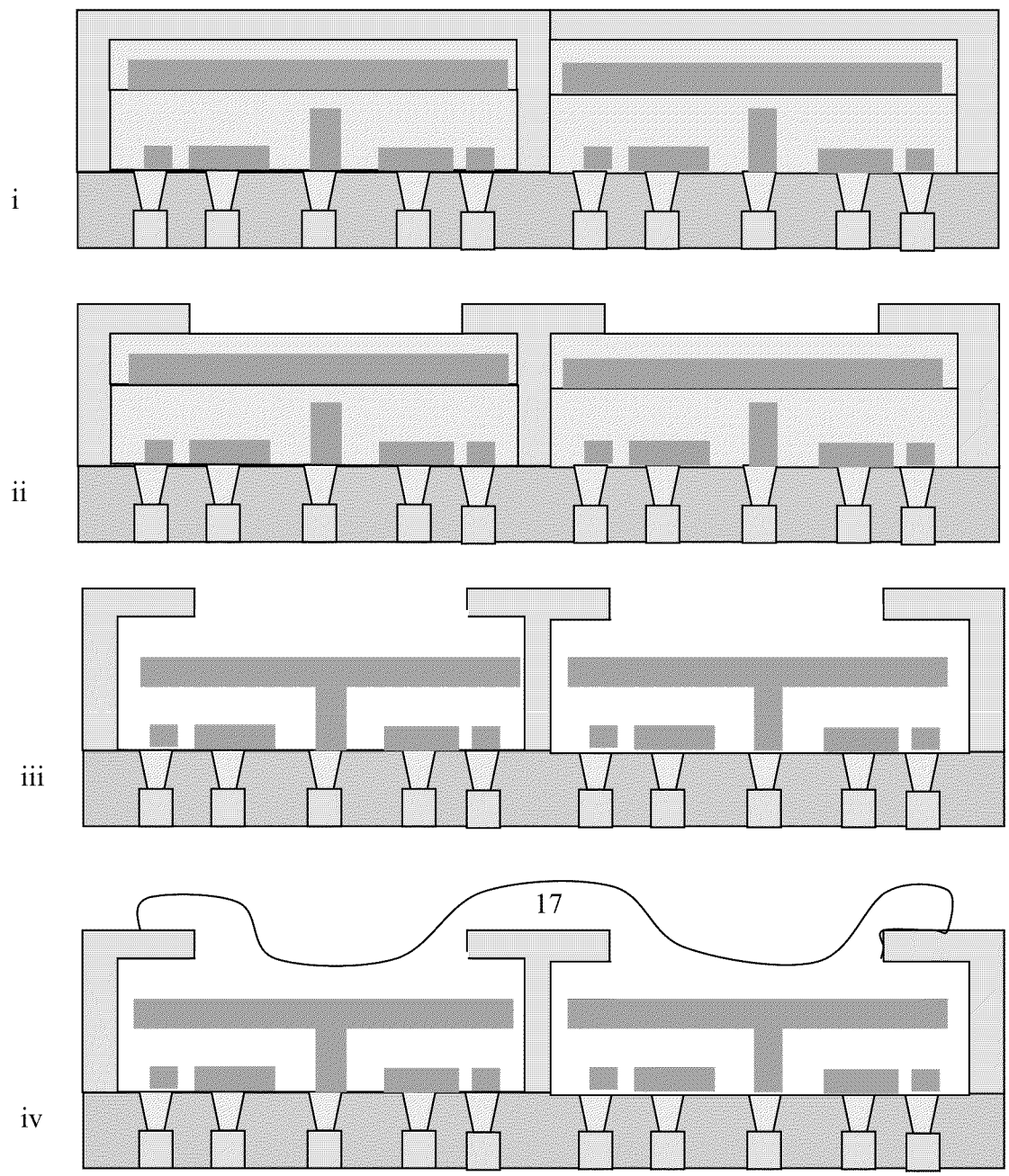
FIG. 1C i-iv shows an alternative fabrication process which is later packaged with a transparent top window in a controlled atmosphere.

The device could also be made with no top window as is shown in FIG. 1C. In this case the fabrication process is stopped at position ii in FIG. 1B. Then, a cap layer is added over the top sacrificial layer. This could be a transparent insulator or a reflective metallic layer. The cap layer is then patterned to open a large hole over the mirror. The cap layer is designed to have an opening as large as possible, but small enough to prevent the mirrors from coming out through the hole once the sacrificial layer is removed. FIG. 1C ii shows the removal of the sacrificial layer and the mirror dropping down on the post.

In the next process the device is housed in a package with a controlled atmosphere and a transparent optical window. The packaging process is a post processing process similar to that used in current MEMS packaging. The device is tested before being diced and packaged it is then coated with a sacrificial layer which holds the mirrors in place. This is shown in as layer 17 in FIG. 1C iv.

It is to be understood that the first sacrificial layer, the reflective metal layer (or mirror layer) and the second or top sacrificial layer may be etched together in the same step and same process using the same etchant. Additionally, while description of the MEMS layer, landing electrodes, and mirror layer have been described with reference to titanium nitride, it is to be understood that the material may comprise an aluminum overcoat to increase the reflectivity of the material. Another suitable conductive material that may be used is TiAlN. Regardless of what material is used for the MEMS layer, landing electrodes, and mirror layer, the materials may be overcoated with a reflective material such as aluminum.

Figure 2:
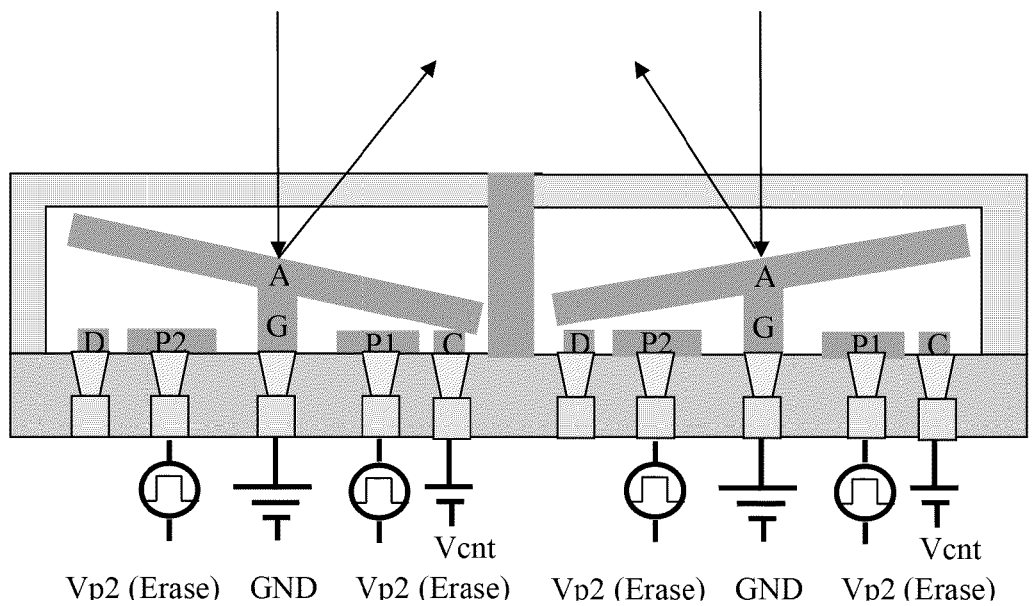
FIG. 2 shows a floating rocker arrangement according to one embodiment.

FIG. 2 shows two rocker mirrors in their own encapsulation. Rocker A sits on post G and can be switched from left to right using electrodes P1 and P2. The rocker lands on electrodes C and D. The state of the rocker can be inferred by measuring the resistance between C and G. In this embodiment each element is housed in its own cavity made from transparent material.

The mirrors have two stable states, either rocked to the left with the rocker landed on post A and touching landing electrode D or leaning to the right with the rocker on post A and touching landing electrode C. The rocker is moved from left to right using pull in electrode P1 and from right to left using pull in electrode P2.

For efficient operation of the display the pixels can be positioned above an SRAM memory cell. The data required for the next pixel operation is housed in the SRAM cell and then the voltage pulse is sent to the pixel to switch it to the next state. Because the switching voltage needs to overcome the adhesion force, the stray voltages applied to the SRAM would normally cause the mirror to move slightly, this is not an issue in the case of the unattached mirror because it is held in place by the adhesion force.

Figure 3:
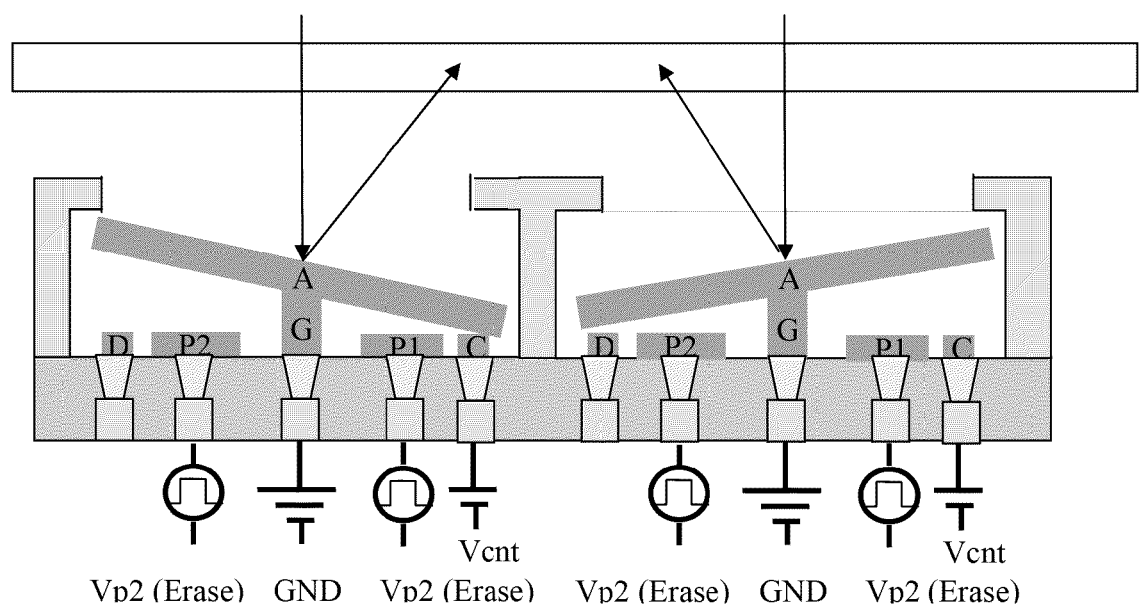
FIG. 3 shows a floating rocker arrangement according to another embodiment.

FIG. 3 shows the embodiment which is packaged with a top window instead of being micro encapsulated during processing. Rocker A sits on post G and can be switched from left to right using electrodes P1 and P2. The rocker lands on electrodes C and D. The state of the rocker can be inferred by measuring the resistance between C and G. In this embodiment each element is housed in its own cavity made from transparent material.

Figure 5:
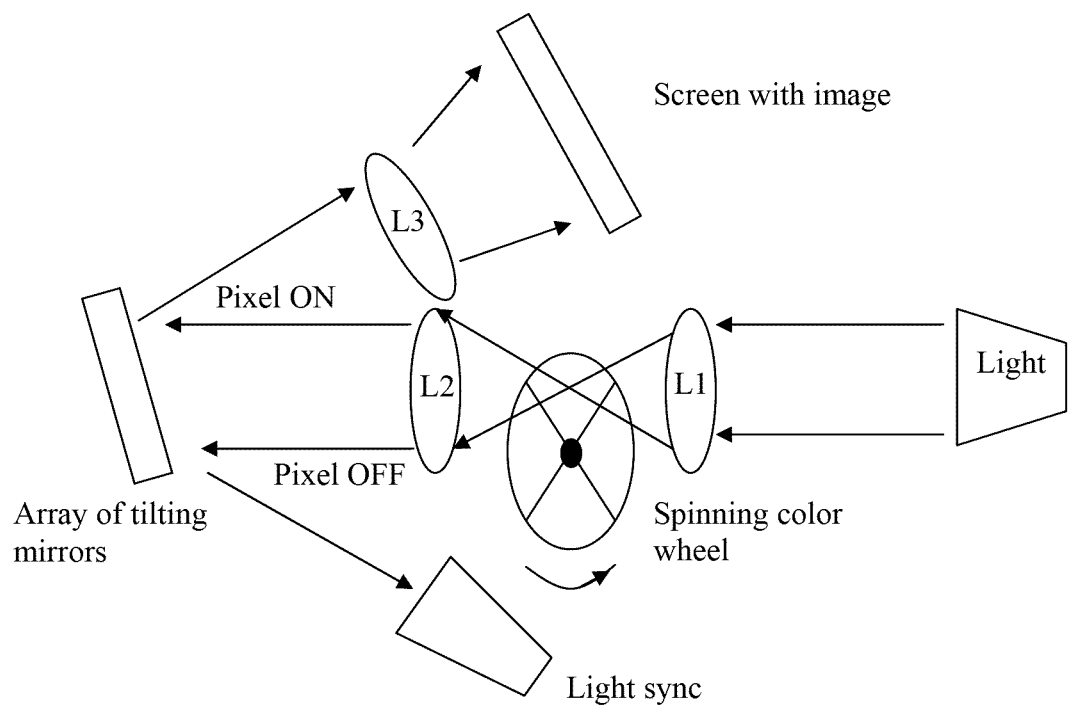
FIG. 5 shows light shining through lens L1 and focused through the spinning color wheel.
Figure 6:
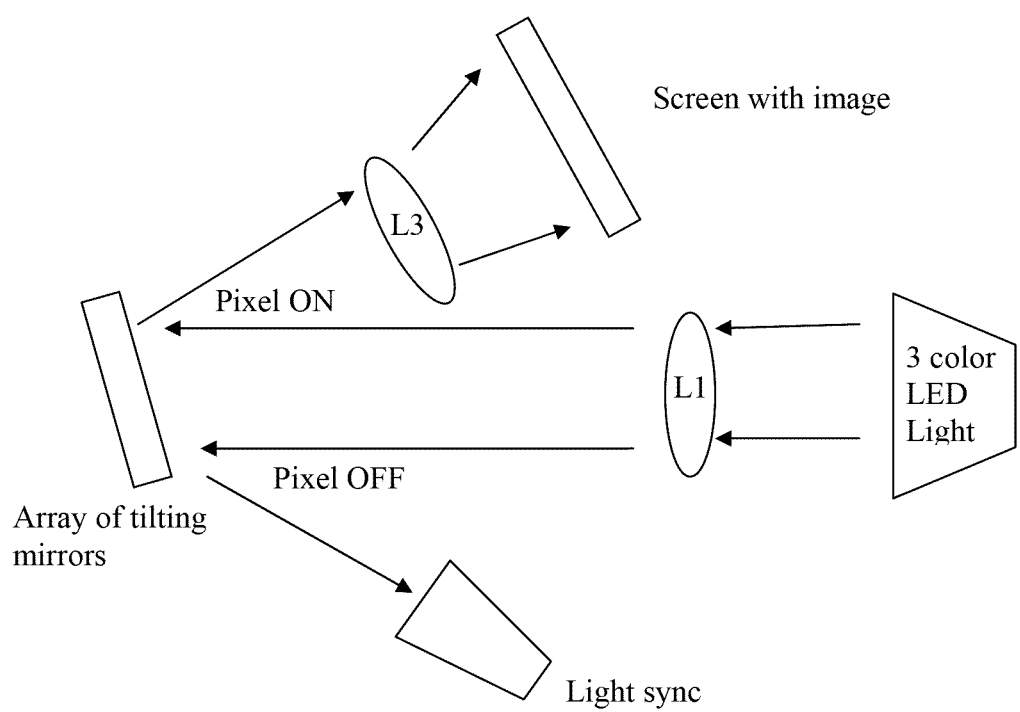
FIG. 6 shows light coming from a 3 color (red, yellow and blue) LED light source through lens L1 onto the array of tilting mirrors.

The packaged rockers can be designed to move over a wider range of angles, but is more expensive to produce. Two possible implementations for using such a device are shown in FIGS. 5 and 6. In FIG. 5 the array is shown to the left and is positioned such that when a mirror pixel is fully to the left the light shines on the optical sync and if it rocks to the right is shines through lens L3 to be focused on to the screen.

Figure 4A:
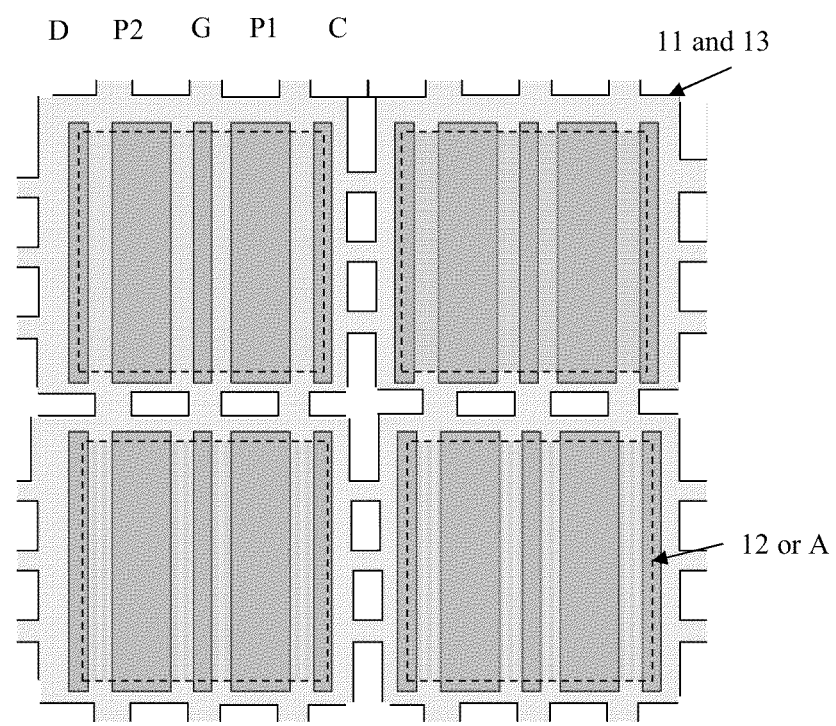
FIG. 4A shows a top view of four pixels after the switching electrodes (P2 and P1), landing electrodes (D and C) and post G have been fabricated.
Figure 4B:
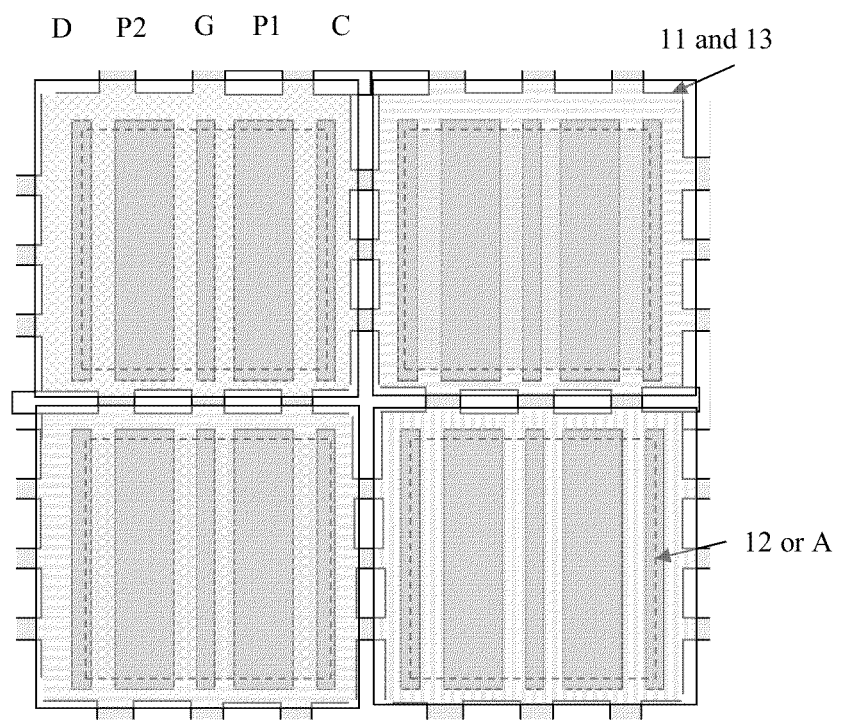
FIG. 4B shows a top cap patterned 14 deposited on top of FIG. 4A and then etched to reveal the side tabs of the sacrificial layers.
Figure 4C:
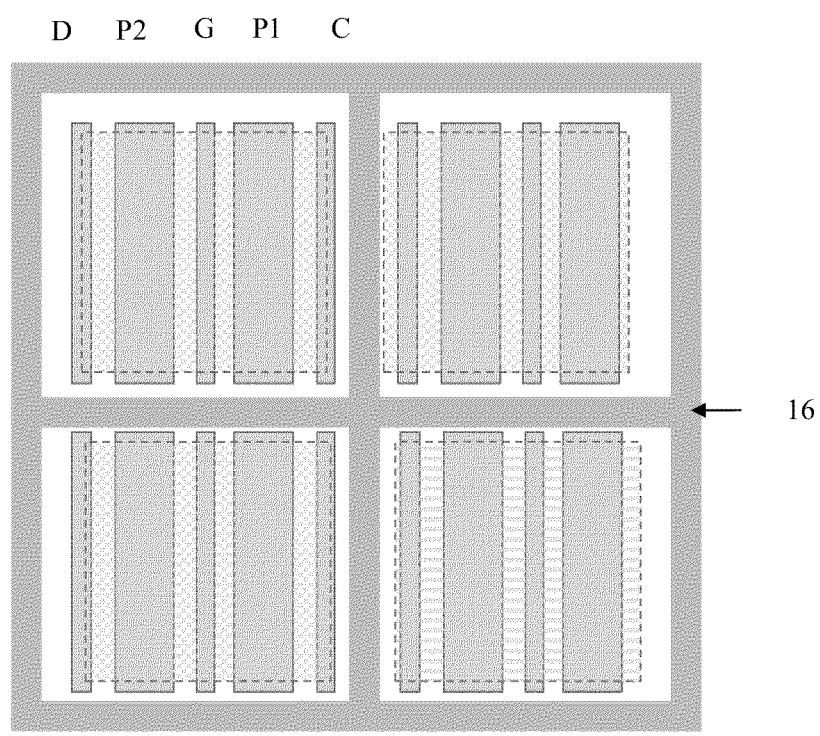
FIG. 4C shows the sacrificial material of FIG. 4B removed.

FIGS. 4A-4C show a top view of an array of four pixels at various times during the fabrication process. The patterned first sacrificial layers 11 and 13 (shown transparent) and the floating pixel rocker shown transparent grey with doted line edges 12 or A.

FIG. 4B shows the top cap patterned 14, deposited on top, and then etched to reveal the side tabs of the sacrificial layers. The side tabs then provide a channel for etching out the sacrificial material under the top cap in the same chamber the seal material is then deposited as shown in FIG. 4C.

In FIG. 4C, the sacrificial material has been removed from under and above the rocker and a sealing layer 16 has been applied to provide a sealed transparent cavity over the floating rocker which is in turn sitting on a rocking post above the switching and landing electrodes.

In FIG. 5, light shines through lens L1 and is focused through the spinning color wheel. The light is then focused through lens L2 onto the array of tilting mirrors. If the mirrors are tilting one way the light from the color wheel is directed through lens L3 to the screen. When the mirror is tilted in the other direction the light is focused into a light sync where it is captured. The individual mirrors are dithered in time with the red, blue, yellow and white sectors of the light wheel to produce the correct color on the screen. The color are mixed by modulating faster than the eye can see so that over a short period of time each pixel can project different colors for different periods of time to give a combined color. In the case of FIG. 5 a white light is used in combination with a color wheel to produce a strobe of red, yellow blue and white. By rotating the mirrors in time with the appropriate flashing color that color can be projected onto the screen.

An alternative technique is shown in FIG. 6 where the color wheel and white lamp is replaced by different colored bright light emitting diodes (LEDs). These can be very quickly electrically switched making it easier to switch quickly which fits in well with the fast switching speed of these free floating rockers.

In FIG. 6, the light comes from a 3 color (red, yellow and blue) LED light source through lens L1 onto the array of tilting mirrors. If the mirrors are tilting one way, the light from the color LED is directed through lens L3 to the screen. When the mirror is tiled in the other direction the light is focused into a light sync where it is captured. The individual mirrors are dithered in time with the red, blue, and yellow LEDs to produce the correct color on the screen. The color are mixed by modulating faster than the eye can see so that over a short period of time each pixel can project different colors for different periods of time to give a combined color.

The floating rocker device described herein may be used in a non-volatile pixel mode so holding a pixel state latched via electrostatic voltage is not required. The state of the display would remain without additional power being consumed. The floating rocker device may be used in a nonvolatile pixel operated in a mode where only the changing data is sent to the array allowing for a reduction in data bandwidth requirements. The non changing data would not lose its state. The floating rocker device may also be used in a nonvolatile pixel operated in a mode where the entire display is parked in the dark state (all pixels in the array are parked where the reflected light cone is out of the display aperture) and then only bright state bits are updated reducing data bandwidth requirements. The floating rocker device may also be used in a nonvolatile pixel enabled from a single transistor for bright state changes while the off state electrode is driven for an array wide clear or a clear in blocks. The floating rocker device may also be used in a nonvolatile pixel that is crosspoint addressed, that is not encapsulated and packaged using tradition means, that is used to optically read the memory bit state after a power failure or during a catastrophic event, that is used for imaging UV light (printing), that is used for imaging coherent IR light (communications), and uses two memory cells per pixel so incoming data can be cached prior to state change thereby eliminating the need for a off chip frame store. Thus, a nonvolatile pixel using the floating rocker device discussed herein is very useful to minimize the electronics overhead of a digital display.

The floating rocker discussed herein is discrete. Because the floating rocker is discrete, the floating rocker is a separate entity that is individually distinct from the other elements in the device. In other words, the floating rocker constitutes a separate entity that is an unconnected and distinct piece. In fact, the floating rocker is not attached to anything within the cavity after it is released. The floating rocker simply rests on a fulcrum.

While the foregoing is directed to embodiments of the present invention, other and further embodiments of the invention may be devised without departing from the basic scope thereof, and the scope thereof is determined by the claims that follow.

The invention claimed is:

1. A method, comprising:
depositing a conductive layer over a first sacrificial layer and a plurality of conductive electrodes;
patterning the conductive layer to form a first mirror element and a second mirror element;
depositing a second sacrificial layer over the first mirror element and the second mirror element;
enclosing the first sacrificial layer, first mirror element, the second mirror element and second sacrificial layer within adjacent cavities, wherein each element is housed in a separate cavity;
removing the second sacrificial layer and the first sacrificial layer to release the first mirror element and the second mirror element within the cavities such that the first mirror element is a discrete, floating first rocker that rests on a first fulcrum and pivots into and out of contact with a first conductive electrode of the plurality of conductive electrodes and the second mirror element is a discrete, floating second rocker that rests on a second fulcrum and pivots into and out of contact with a second conductive electrode of the plurality of conductive electrodes; and
sealing the cavities.

2. The method of claim 1, further comprising:
depositing a first titanium nitride layer over a substrate;
patterning the first titanium nitride layer;
etching the first titanium nitride layer;
depositing a second titanium nitride layer over the etched, first titanium nitride layer;
patterning the second titanium nitride layer;
etching the second titanium nitride layer to form the plurality of conductive electrodes;
depositing the first sacrificial layer over the plurality of conductive electrodes;
patterning the first sacrificial layer;
etching the first sacrificial layer;
forming the first mirror element and the second mirror element;
depositing the second sacrificial layer over the first mirror element and the second mirror element;
depositing a transparent layer over the second sacrificial layer to encapsulate the second sacrificial layer, the first mirror element, the second mirror element, the first sacrificial layer, and the one or more electrodes;
etching a hole through the transparent layer;
plasma etching the second sacrificial layer and the first sacrificial layer to form the discrete, first floating rocker and the discrete, second floating rocker; and
filling the hole to seal the cavities.

3. The method of claim 1, wherein the conductive layer comprises titanium nitride.

4. The method of claim 3, further comprising an aluminum layer over the titanium nitride layer.

5. The method of claim 4, wherein the plurality of conductive electrodes comprises titanium nitride.

6. The method of claim 1, wherein the plurality of conductive electrodes comprise a transparent conductive material.

7. The method of claim 1, wherein the cavity is bound by a transparent window.

* * * * *

UNITED STATES PATENT AND TRADEMARK OFFICE
CERTIFICATE OF CORRECTION

| | | |
|---|---|---|
| PATENT NO. | : 8,488,230 B2 | Page 1 of 1 |
| APPLICATION NO. | : 12/862036 | |
| DATED | : July 16, 2013 | |
| INVENTOR(S) | : Smith et al. | |

It is certified that error appears in the above-identified patent and that said Letters Patent is hereby corrected as shown below:

In the Specification:

Column 6, Line 43, please delete "doted" and insert -- dotted -- therefor.

Signed and Sealed this
Eighth Day of October, 2013

Teresa Stanek Rea
*Deputy Director of the United States Patent and Trademark Office*